United States Patent [19]  
Johnson

[11] 4,096,055  
[45] Jun. 20, 1978

[54] ELECTRON MICROSCOPY COATING APPARATUS AND METHODS

[76] Inventor: Andrew G. Johnson, 1714 Agadir St., Concord, Calif. 94518

[21] Appl. No.: 755,356

[22] Filed: Dec. 29, 1976

[51] Int. Cl.$^2$ .............................................. C23C 15/00
[52] U.S. Cl. ................................ 204/298; 118/49.1; 118/500; 118/503; 204/192 N
[58] Field of Search ............... 204/298, 192 R, 192 N; 118/49, 49.1, 49.5, 48, 500, 503

[56] References Cited

U.S. PATENT DOCUMENTS

| | | | |
|---|---|---|---|
| 3,329,601 | 7/1967 | Mattox | 204/298 |
| 3,351,543 | 11/1967 | Vanderslice | 204/192 |
| 3,563,873 | 2/1971 | Beyer | 204/192 |
| 3,633,537 | 1/1972 | Howe | 118/48 |
| 3,656,453 | 4/1972 | Tousimis | 118/48 |
| 3,669,871 | 6/1972 | Elmgren et al. | 204/298 |
| 3,783,822 | 1/1974 | Wollam | 118/49.1 |
| 3,858,547 | 1/1975 | Bergfelt | 118/49 |
| 4,013,830 | 3/1977 | Pinch et al. | 358/128 |

Primary Examiner—Aaron Weisstuch  
Attorney, Agent, or Firm—Donald C. Feix

[57] ABSTRACT

An electron microscopy coating apparatus and coating methods incorporate a specimen mounting arrangement which is used both for coating specimens which are to be viewed by scanning electron microscopy (SEM) and for coating specimens which are to be viewed by transmitted electron microscopy (TEM) and for coating specimens for the recently developed scanning-transmitted electron microscopy (STEM).

The coating apparatus and method includes a hood and a mixer disc for coating by cold cathode sputtering and can also be used (with arc type electrodes in place of the hood and mixer disc) for coating by either charged ion evaporation or straight film evaporation.

A biasing direct current provides a differential charge for cold cathode sputtering and charged ion evaporation.

For charged ion evaporation the negative lead of the direct current is connected to one electrode of the evaporator and the positive lead of the direct current is connected to the base to provide a differential charge (a negative charge on the evaporated ion and a positive charge on the specimen) to attract the evaporated ions to the specimen.

8 Claims, 5 Drawing Figures

ELECTRON MICROSCOPY COATING APPARATUS AND METHODS

BACKGROUND OF THE INVENTION

This invention relates to apparatus and methods for coating specimens used in electron microscopy.

There are two techniques that are used for viewing specimens with an electron microscope. These two techniques are scanning electron microscopy (SEM) and transmitted electron microscopy (TEM).

Both SEM and TEM usually require that the specimen be coated. However, the required characteristics of the coating are different for the two viewing techniques.

For SEM the electron beam impacts the specimen and is rastered across the surface of the specimen to produce emitted secondary electrons, X-rays and other types of radiation from the coated surface. This secondary emitted radiation is then scanned and used to produce either an image on a cathode ray tube screen or on a photographic plate. The image appears as a three-dimensional image, much like the picture on a television set, and is a greatly magnified reproduction of the surface topography of the specimen.

Specimens prepared for viewing by SEM are often coated by a sputtering technique. This technique uses apparatus comprising a two-electrode glow discharge system having a cathode and anode. The cathode, which is made of the material to be deposited, is sputtered by means of an electrical glow discharge in an atmosphere of gas at a pressure generally between 1 to $10^{-2}$ torr. The sputtered cathode material is deposited on a substrate to form a film.

A sputtering apparatus made by Technics, Inc. and having the specimen mounted parallel to the cathode, is often used for coating specimens to be viewed by SEM.

In TEM the electron beam is transmitted through the specimen. The specimen in this case has to be electron dense to defract the electrons passing through the specimen. The different parts of the specimen defract the electron beam in different amounts, depending upon the composition and density of the different parts of the specimen. The defracted electrons are then used to produce the final image (which again can be displayed on a cathode ray tube or used to produce a negative for photographic print).

Coatings are used for TEM specimens to improve the electron beam defracting characteristics of the specimen and also to help stabilize the specimen as the electron beam is being transmitted through the specimen.

Specimens used for TEM are often coated by a film produced by evaporating electrodes of carbon or some other metal. An evaporative film coating apparatus made by Varian Associates, Inc. is often used for coating TEM specimens.

The prior art techniques for coating specimens for SEM have presented a number of problems.

All of the surface of the specimen to be viewed must be coated sufficiently so as to be conductive. Any part of the surface which is not sufficiently coated will charge, rather than emit the secondary radiation. This is a particular problem with biological specimens having undersurfaces and recessed surfaces that are difficult to present to the coating particles. Prior art coating apparatus which presented the specimen to the cathode in a planar or essentially a planar attitude often were not effective to provide the required coatings on all the surfaces of the specimen.

Overheating of the specimen during coating was another problem in the prior art, particularly in the case of biological specimens having fragile membranes which could be distorted or otherwise damaged by excessive heating. In attempts to avoid specimen overheating, the prior art often used water cooling on the base and also on the cathode. However, the prior art water cooling techniques still resulted in specimen overheating in some instances.

In TEM, overheating of the specimen by the transmitted electron beam (which is at about 110° C) can be a problem. Overheating produces shrinking of the specimen and shifting and blurring of the image. This has been a definite problem with some specimens coated by prior art coating techniques. That is, the prior art coating techniques in many instances have not provided either the required accentuation of the varying density of the specimen or the required stabilizing of the specimen to permit long enough durations of exposure (without distortion of the specimen).

SUMMARY OF THE INVENTION

It is an important object of the present invention to overcome the problems of the prior art coating techniques for SEM and TEM.

It is a particular object of the present invention to provide one basic coating apparatus which can be used to coat specimens for both SEM and TEM.

It is another object of the present invention to coat all surfaces of SEM specimens uniformly, including underneath and recessed surfaces.

It is another object of the present invention to coat TEM specimens with coatings that produce better specimen contrast and greater specimen stability than was possible with prior art coating techniques.

The coating apparatus of the present invention comprises one basic coating apparatus which can be readily adapted for use either as a cold cathode sputterer, a charged ion evaporator or a straight film evaporator.

In each application the coating apparatus includes a base which has a turntable mounted for rotation about a vertical axis.

A plurality of individual specimen holders are mounted for rotation within the turntable. The axis of rotation of each specimen holder is inclined at an angle with respect to the angle of rotation of the turntable. A transmission interconnects all of the specimen holders for rotation as the turntable itself is rotated so that each specimen is rotated in both an overall circular orbit and also in a planetary rotation within the orbit and at an inclined angle with respect to the plane of the orbit.

The speed of rotation is variable and the direction of rotation can be reversed so that each specimen is, in effect, swirled and oscillated within the coating environment to enable all surfaces of the specimen to be presented to and impacted by the coating particles.

In both cold cathode sputtering and charged ion evaporation a direct current voltage differential is imposed between the base and one electrode to provide a negative charge on the source of sputtered atoms or evaporated molecules and a positive charge on the specimen. The amount of this differential charge is variable to regulate the rate at which the specimen is coated and to control the amount of heating of the specimen by the deposited coating.

The sputtering coating technique of the present invention permits matching a number of variables to provide the optimum coating for each particular specimen and to avoid problems of specimen overheating and prior art requirements of water cooling.

The speed of rotation of the specimen and the speed of counter-rotation of the specimen can be varied.

The intensity of the arc between the hood and the mixer disc can be regulated to absorb the higher energy atoms and to prevent specimen distortion resulting from overheating of the specimen during coating.

The accelerating potential between the charged electrode and the oppositely charged specimen can be varied.

The amount of vacuum in the sputtering enclosure can be varied, and the amount of inert gas let into the vacuum can also be varied.

The sputtering technique of the present invention minimizes heat distortion problems because the present invention uses lower voltage and uses an absorber (the regulation of the intensity of the arc) which collects the higher energy atoms. Also the mixer disc is more positively charged than the specimens so that the specimens are subjected to lower energy impact by the coating particles.

In one particular embodiment of the invention a current of 10 milliamps is used for ten minutes and at a voltage differential of 1500 volts between the anode and the cathode in an inert gas atmosphere at a pressure of $10^{-2}$ torr and with the specimens connected to a positive potential of approximately 600 volts. By way of comparison, one prior art sputtering technique used for coating similar specimens used 50 milliamps and a voltage differential of 2400 volts between the electrodes for a maximum coating period of three minutes.

For charged ion evaporation the present invention uses alternating current on the filaments of the electrodes to heat them (at low heat), and a biasing direct current potential is used between one electrode and the specimen to provide a differential charge.

In this coating technique of the present invention a higher vacuum (e.g. $10^{-4}$ torr) is used, and a number of variables are provided by the present invention.

As in the cold cathode sputtering technique, the charged ion evaporation technique of the present invention permits variation of the speed and direction of rotation of the specimen. Rotation of the specimen prevents a straight build-up that would occur if the specimen is stationary and provides a "shadow casting" effect which accentuates the contrast produced by the variable density of different thicknesses of the specimen. The direct current biasing potential can be varied from 0 to 1000 volts to change how fast the ions are drawn into the specimen, and the rate of coating can be slowed down by decreasing the differential charge to decrease the heating effect produced by the coating particles.

In the straight film evaporation technique of the present invention the biasing direct current potential is not used, but the present invention still provides a number of control variables over the coating technique.

These variables include variation of the speed and direction of rotation. In this case higher speeds of rotation are used to lessen the heat distortion problems of the specimens.

Other and further objects of the present invention will be apparent from the following description and claims and are illustrated in the accompanying drawings which, by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWINGS

In FIG. 2 portions of the coating apparatus have been broken away and are shown in cross section to illustrate details of construction.

FIG. 4 is shown with the bell jar removed, and parts of the coating apparatus have been broken away in FIG. 4 to show details of construction.

FIG. 5 illustrates the coating apparatus of the present invention as set up for charged ion evaporation coating of specimens.

DETAILED DESCRIPTION OF THE PREFERRED EMBODIMENTS

Figure 1:
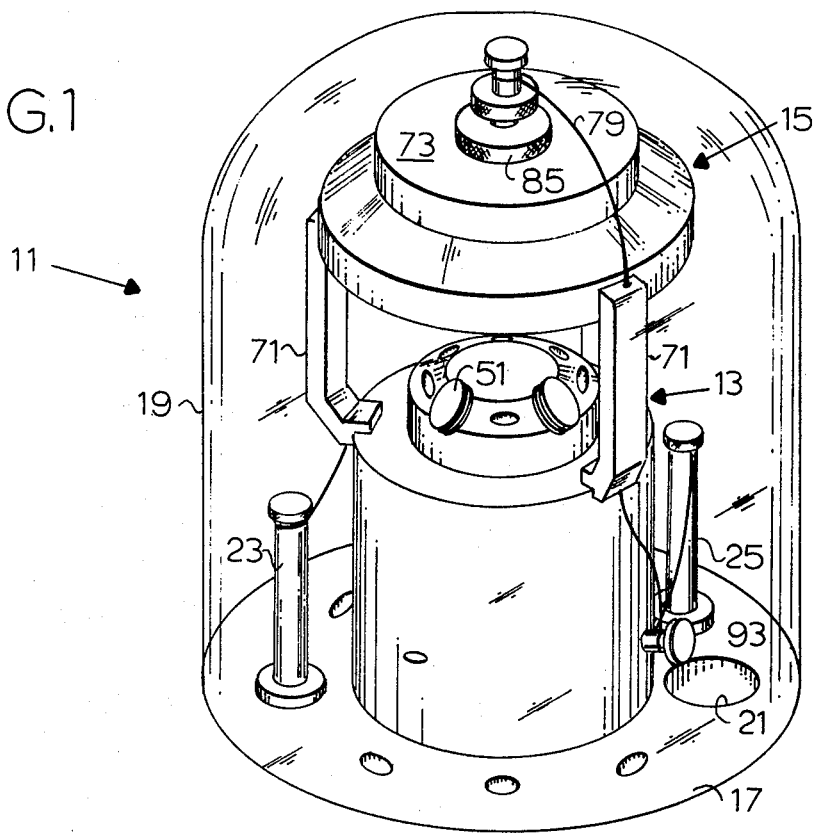
FIG. 1 is an isometric view of a coating apparatus constructed in accordance with one embodiment of the present invention. The embodiment shown in FIG. 1 is a cold cathode sputtering coating apparatus and is used for coating specimens to be viewed by SEM.
Figure 2:
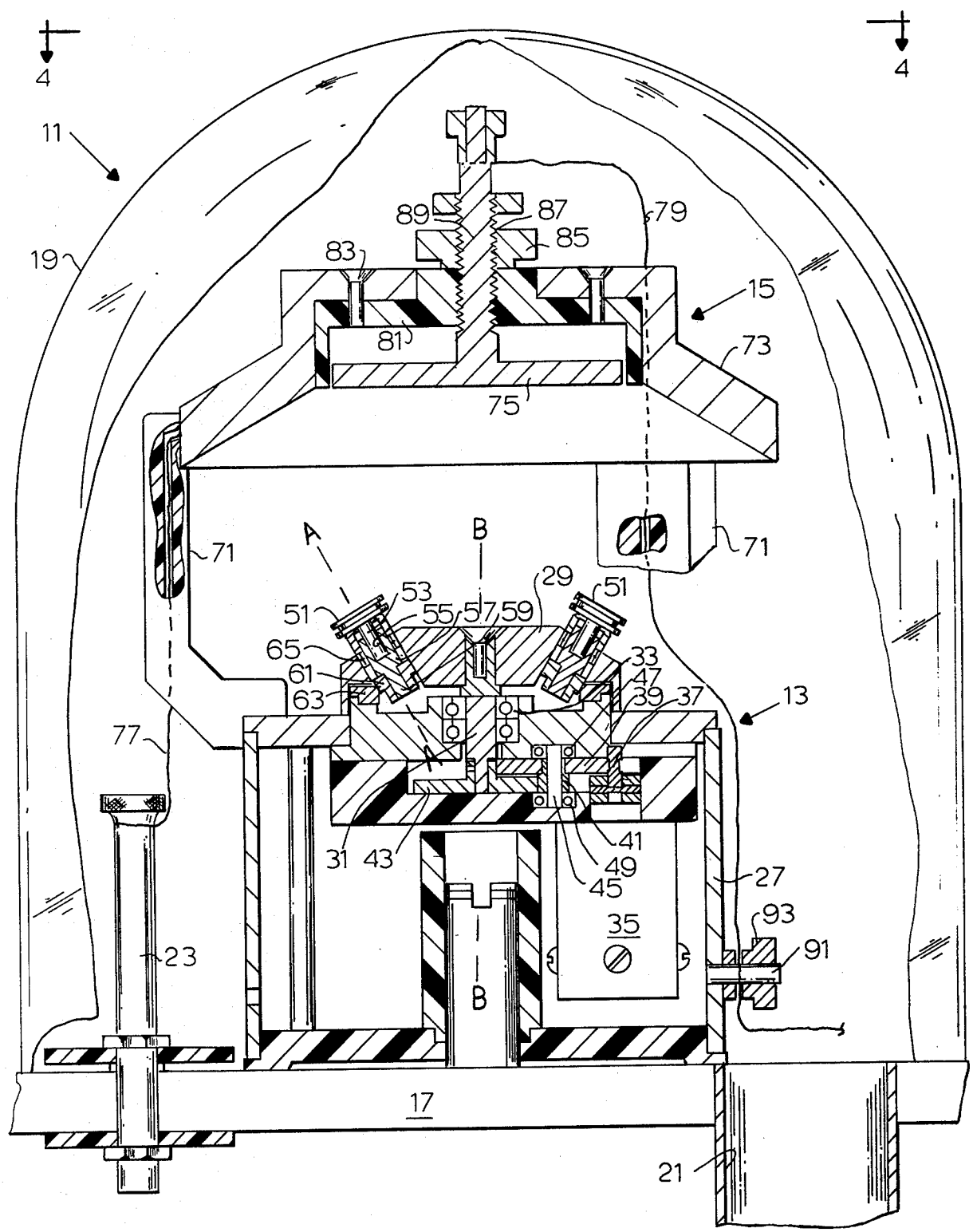
FIG. 2 is an enlarged front elevation view of the coating apparatus shown in FIG. 1.

One embodiment of a coating apparatus constructed in accordance with the present invention is indicated generally by the reference numeral 11 in FIGS. 1 and 2.

The coating apparatus 11 shown in FIGS. 1 and 2 is a cold cathode sputtering coating apparatus and comprises a lower, base assembly 13 and an upper, hood and mixer disc assembly 15.

As illustrated in FIG. 1 the cold cathode sputtering coating apparatus 11 is mounted on an evaporator base plate 17 and is enclosed within a bell jar 19.

A partial vacuum is produced within the bell jar 19 by pumping air from the interior of the bell jar through an outlet 21.

Two electrical terminal posts 23 and 25 are connected to the evaporator base plate 17.

Figure 5:
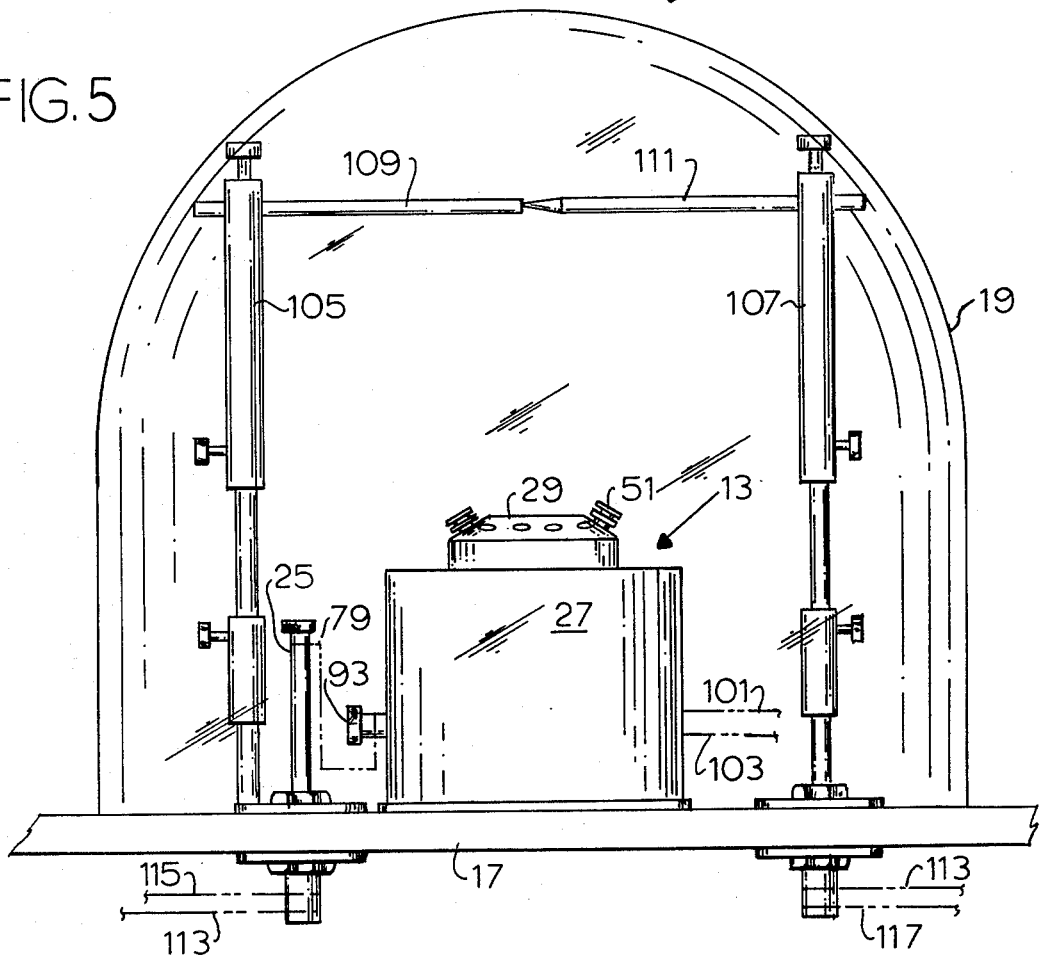
FIG. 5 is a front elevation view of another embodiment of a coating apparatus constructed in accordance with the present invention.

The terminal post 25 is connected to a positively charged DC power line, and the terminal post 23 is connected to a negatively charged DC power line by electrical leads (not shown in FIG. 1 but corresponding to leads 115 and 117 in FIG. 5). The electrical potential differential between the terminal posts 23 and 25 can be varied from 0 to 1500 volts by conventional controls (also not shown in FIG. 1).

As best shown in FIG. 2, the base assembly 13 comprises a frame 27 mounting a turntable 29 for rotation at the upper part of the base assembly 13.

The turntable 29 has a spindle 31 which is mounted for rotation within a bearing 33.

The spindle 31 is connected for rotation by a drive motor 35 through a gear train which includes gear teeth on an output shaft 37 of the drive motor, a spur gear 19, a spur gear 41 and a spur gear 43. The spur gears 39 and 41 are keyed to a common support shaft 45 which is mounted for rotation within bearings 47 and 49. The spur gear 43 is keyed for rotation with the spindle 31.

The geared output shaft 37 and the spur gears 39, 41 and 43 thus serve as reduction gearing for driving the turntable 29 at a considerably slower speed of rotation than the speed of rotation of the drive motor 35.

In a preferred embodiment of the present invention the drive motor 35 is a DC motor. The drive motor is powered by electrical leads (which are not shown in FIG. 2 but which correspond to the leads 101 and 103 of FIG. 5), and the speed of rotation of the drive motor is varied by a variable speed control which permits the speed to be varied from 0 rmp to 300.

A plurality of specimen holders 51 are mounted for rotation within the turntable 29.

As best shown in FIGS. 1 and 2 each specimen holder 51 comprises a circular disc, on which the specimen is mounted, and a support shaft 53. The support shaft 53 slips in and out of a bore 55 of a sleeve 57. Each sleeve 57 is attached to a spindle 59. A planetary gear 61 is keyed to the spindle 59, and each planetary gear 61 for each specimen holder engages a ring gear 63 attached to the frame 27 of the base assembly 13.

The sleeve 57 and spindle 59 are mounted for rotation within the turntable 29 by a bearing 65.

As best illustrated in FIG. 2 the axis of rotation A—A of each specimen holder 51 is inclined at an angle with respect to the axis of rotation B—B of the turntable 29.

Thus, as the turntable 29 is driven in rotation by the drive motor 35, each specimen holder 51 is moved in a circular orbit about the axis B—B and each specimen holder 51 is also driven in planetary rotation about its individual axis A—A because of the geared engagement of the planet gears 61 with the non-rotating ring gear 63.

In a preferred embodiment of the present invention ten specimen holders 51 are mounted in the turntable 29 and each specimen holder 51 is rotated six times about its own axis A—A for each complete revolution of the turntable 29 about the axis B—B.

In a preferred embodiment of the present invention each axis A—A is inclined at a 30° angle with respect to the axis B—B. This angular inclination and planetary rotation of each specimen holder 51 insures that all surfaces of the specimen to be coated (including the undersurfaces of the specimen and the recessed surfaces of the specimen) are presented to the coating particles distributed in the space above the turntable 29 so that all surfaces of the specimen can be coated, as will become more apparent from the description to follow.

As will also become more apparent from the description to follow, the biasing effect of the DC potential between the base assembly 13 and the hood and mixer disc assembly 15 also serves to provide effective control of the coating process so that the coating can be applied to the specimen in increments of substantially 1 Angstrom thickness of coating particles at a time. A desired coating, such as 75 Angstroms thickness, can therefore be built up substantially uniformly over the entire surface of the specimen.

The upper hood and mixer disc assembly 15 is supported from the base assembly 13 by three electrically non-conductive support arms 71.

The hood and mixer disc assembly 15 comprises a hood 73 and a mixer disc 75.

The hood 73 is connected to the negatively charged terminal post 23 and serves as the cathode while the mixer disc 75 is connected to the positively charged terminal post 25 and serves as the anode.

In one embodiment of the invention the hood is made of stainless steel and is Teflon plastic coated and the mixer disc is made of aluminum.

As illustrated in FIG. 2 the electrical lead 77 extends from the terminal post 23 to the hood 73, and the electrical lead 79 connects the mixer disc 75 to the positively charged terminal post 25.

Each support arm 73 is constructed of material which is electrically non-conductive so that the support arms 73 act as insulators.

An insulator cap 81 (of Delrin plastic or other suitable material) is mounted within the interior of the upper part of the hood 73 by screws 83, and the mixer disc 75 is mounted within the insulator cap 81 by a nut 85 which threadably engages with screw threads 87 on an outer surface of a positioning shaft 89 formed integral with and extending upwardly from the mixer disc 75. By rotating the positioning nut 85, the vertical position of the mixer disc 75 can be varied within the hood 73, and this provides a control over the arc of released atoms between the cathode 73 and the anode 75 because of the containment of the electron cloud provided by the central location and vertical positioning of the anodic mixer disc 75 within the cathode hood 73. This control of the arc and containment of the electron cloud also minimizes heat distortion of the specimens by keeping a major portion of the heat producing electron cloud up and above the level of the specimens.

As illustrated in FIG. 2 the electrical lead 79 which connects the positively charged terminal post 25 to the mixer disc 75 is also electrically connected to the base frame 27 by a screw 91 and nut 93.

Figure 4:
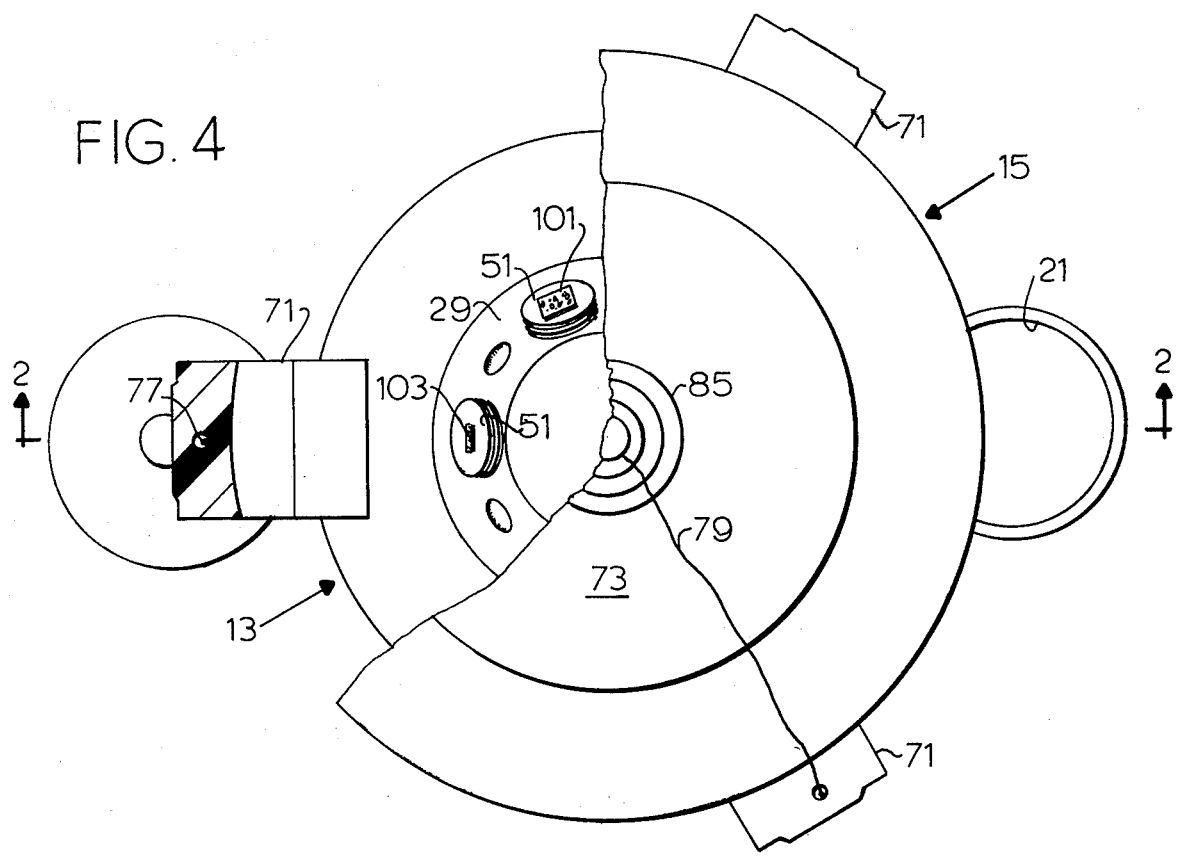
FIG. 4 is a top plan view of the coating apparatus shown in FIGS. 1 and 2.

FIG. 4 shows specimens 101 and 103 mounted on specimen holders 51.

The specimen 101 in FIG. 4 is mounted in a pyramid shape mold, and the mold is an inverted, truncated pyramid shape for holding epoxy resin and a specimen at the lower, flat face of the mold. The mold has a shallow depth for facilitating orientation of the specimen within the resin prior to setting up of the resin and for minimizing the depth of resin through which light must be refracted in the viewing of the specimen under a disecting microscope. The mold also has a plurality of small recesses in the lower, flat face for insuring that there is resin between the specimen and the flat face and for providing contrast, by light refraction through the recesses, when viewing under the disecting microscope to permit trimming of the specimen block at the desired plane.

In the operation of the cold cathode sputtering coating apparatus 11 illustrated in FIGS. 1, 2 and 4 and described above, the specimens to be coated are mounted on the specimen holders 51, and the specimen holders 51 are then placed into the related sleeves 57 of the turntable 29. The bell jar 19 is then placed over the coating apparatus, and the pressure within the bell jar is evacuated to produce the desired degree of negative atmosphere, usually 1 to $10^{-2}$ torr for the sputtering, by pumping air out of the outlet 21.

Depending upon the particular specimen being coated and the particular material being used to coat the specimen, the desired electrical potential is applied across the terminal posts 23 and 25. For example, when coating biological specimens with gold, an electrical potential difference of 1600 DC volts is applied across the terminal posts 23 and 25 with the terminal post 23 at 0 volts and the terminal post 25 at +1600 DC volts.

The motor 35 is energized to rotate the turntable 29 and the specimen holders 51 in the orbital and planetary rotations. For sputtering, the specimens 51 are rotated in a relatively slow range of speeds by the variable speed control of the drive motor 35. Thus, for coating biological specimens, the turntable 29 is rotated in the range of 0 to 100 rpm, and, as pointed out above, each specimen holder 51 is rotated on its own axis 6 times for each rotation of the turntable 29.

The direction of rotation of the drive motor 35 is also reversible, and usually in cold cathode sputtering the specimens are rotated in opposite directions for equal lengths of time to insure that all surfaces of the specimen are uniformly coated.

In one specific embodiment a current of 10 milliamps at the 1600 volts is used for coating biological specimens and the coating is continued for about 10 minutes.

The arc between the cathode hood 73 and the anode sputtering disc 75 is regulated to provide the desired upward containment of the electron cloud and controlled downward sweep of the arc of released coating atoms. This regulation is obtained by adjusting the vertical position of the mixer disc 75, by means of the adjustment nut 85, and by regulating the degree of evacuation within the bell jar 19 and also by admitting a regulated quantity of an inert gas, such as argon (through an opening in the base plate 17 not illustrated in the drawings), after the interior of the bell jar has been partially evacuated and also by regulating the electrical potential difference across the terminal posts 23 and 25.

The regulation of the electrical potential difference between the charge on the specimen holders 51 and the cathode 73 also is useful in controlling the rate of deposition of the coating particles onto the specimens.

By proper regulation of each of these variables it is possible with the apparatus of the present invention to apply a uniform coating to a specimen in a layer of about 1 Angstrom thickness.

For proper conductance under the scanning electron microscope, a coating of approximately 75 Angstroms thickness is required, and the coating apparatus of the present invention permits this thickness of coating to be built up in a substantially uniform manner over the entire surface of the specimen by the cold cathode sputtering and with no heat distortion problems, and without auxiliary cooling of the base as required by prior art devices. Heat distortion problems are avoided by the present invention because the present invention uses a lower voltage than the prior art techniques and provides an absorber (the dialing in of the arc is described above) for collecting the higher energy atoms. Also, the specimens are located with respect to the arc at a position at which the movement of the atoms is slower, and the specimens themselves have a lower charge (with respect to the cathode) than the mixer disc. All of these factors are significant in reducing the problems of heat distortion.

Figure 3:
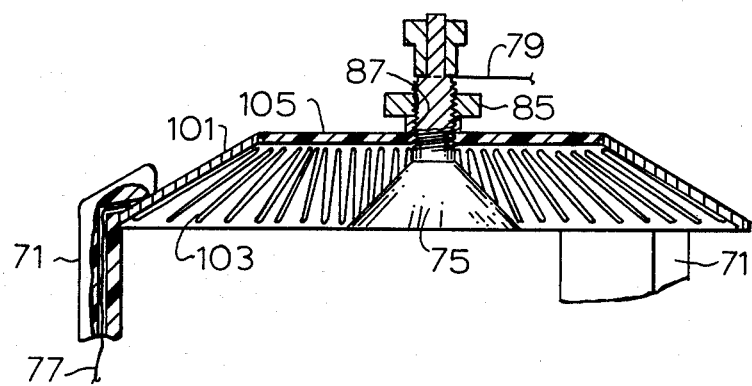
FIG. 3 is a fragmentary cross section view of an alternative embodiment of the hood and mixer disc assembly of the cold cathode sputtering coating apparatus shown in FIGS. 1 and 2.

FIG. 3 illustrates a modified hood and mixer disc assembly constructed in accordance with another embodiment of the present invention.

In the FIG. 3 embodiment the support arms 71 are constructed of a good insulating material (Teflon plastic in a preferred embodiment of the present invention).

The hood, in the FIG. 3 embodiment, comprises a conically shaped stainless steel part 101 which supports a gold wire 103 arranged in loops as illustrated and supported from the inner surface of the hood part 101.

The hood, in the FIG. 3 embodiment, also includes an upper, central insulator part 105 (preferably made of Teflon plastic).

The mixer disc 75, in the FIG. 3 embodiment, has a cone-shaped lower portion, and in a preferred embodiment is made of aluminum.

The upper stem of the mixer disc 75 has screw threads 87 which coact with corresponding threads in the insulator part 105 of an adjustment nut 85 so that rotation of the adjusting nut 85 repositions the mixer disc 75 vertically within the hood.

In the FIG. 3 embodiment the lead 77 from the terminal post 73 extends upward through one of the support arms 71 and is connected to the hood portion 101 as illustrated, and the lead 79 from the terminal post 25 is connected to the mixer disc 75 as illustrated.

The FIG. 3 embodiment provides advantages of ease of change of sputtered material, low cost changeover of sputtered material, and a complete draw of sputtered atoms from all of the wire at one time.

The 45° angle of the mixer disc 75 in the FIG. 3 embodiment in combination with the approximate 30° angle of mounting of the wire provides an arc potential which draws sputtered atoms from all of the wire at the same time to provide evenness of the sputtered material.

FIG. 5 illustrates an embodiment of the coating apparatus of the present invention used for charged ion evaporation coating of the specimens.

Parts in FIG. 5 which correspond to like parts in the other Figures of the drawings are designated by like reference numerals.

Thus, in the FIG. 5 embodiment individual specimens are mounted on specimen holers 51. The specimen holders 51 are in turn mounted for rotation within a turntable 29 and the turntable 29 is in turn mounted for rotation within base assembly 13 so that the individual specimens are rotated in an orbit and also in planetary rotation within the orbit by the drive motor. The electrical leads for the drive motor are indicated by the reference numerals 101 and 103 in FIG. 5.

The hood and mixer disc assembly is removed for the charged ion evaporation coating process of the FIG. 5 embodiment, and two electrode holders 105 and 107 hold filaments 109 and 111 of the material to be evaporated, usually carbon. Alternating current is supplied to the electrode holders 105 and 107 by electrical lines indicated generally by the reference numeral 113 in FIG. 5.

In the charged ion evaporation coating process of the present invention a biasing direct current potential is used between one electrode and the specimens to provide a differential charge. As illustrated in FIG. 5 a positive direct current potential is applied to the terminal post 25 by an electrical lead 115, and this positive direct current potential is applied to the base assembly 13 and specimen holders 51 by a lead 79 and a connecting nut 93.

A negative direct current potential is applied to the electrode holder 107 by an electrical lead 117.

In the operation of the charged ion evaporation apparatus of FIG. 5, alternating current is applied to the filaments of the electrodes to heat them (at low heat), and the biasing direct current potential is used between one electrode and the specimen to provide a differential charge.

In this coating technique a higher vacuum (e.g., $10^{-4}$ torr) is used, and a number of variables are provided by the apparatus of the present invention.

As in the cold cathode sputtering technique, the charged ion evaporation technique of the present invention permits variation of the speed and direction of rotation of the specimen. The rotation of the specimen prevents a straight build-up that would occur if the specimens were held stationary. Rotation also provides a "shadow casting" effect which accentuates the contrast provided by the variable density of different thicknesses of the specimen.

The direct current biasing potential can be varied from 0 to 100 volts to change how fast the ions are drawn into the specimen, and the rate of coating can be slowed down by decreasing the differential charge to decrease the heating effect produced by the coating particles.

The direction of rotation can also be changed.

The apparatus of FIG. 5 can easily be modified by provide straight film evaporation. In straight film evaporation the biasing direct current is not used, but the present invention still provides a number of control variables over the coating technique.

These variables include variation of the speed and direction of rotation. Higher speeds of rotation are used in the straight film evaporation technique than in the sputtering or charged ion evaporation technique to lessen the heat distortion problems of the specimens.

While I have illustrated and described the preferred embodiments of my invention, it is to be understood that these are capable of variation and modification, and I therefore do not wish to be limited to the precise details set forth, but desire to avail myself of such changes and alterations as fall within the purview of the following claims.

I claim:

1. A coating apparatus for coating a specimen to be viewed by electron microscopy and comprising,
    particle forming means for releasing particles to be deposited on the specimen as a coating,
    specimen support means for supporting the specimen being coated,
    said specimen support means including a base, a turntable mounted for rotation in the base, and a specimen holder mounted for rotation in the turntable about an axis displaced from the axis of rotation of the turntable,
    drive means for rotating the specimen holder about its axis at the same time that the turntable is rotated about its axis so that the specimen is rotated in both an orbit and in a planetary motion in the orbit, and wherein the axis of rotation of the specimen holder is inclined at an angle with respect to the axis of rotation of the turntable so that the angular inclination of the specimen and the planetary movement of the specimen present all surfaces of the top and bottom of the specimen to the released coating particles and wherein the particle forming means include a hood and a mixer disc and including electrical means for producing an arc of sputtered atoms between the hood and mixer disc by charging the hood as a cathode and charging the mixer disc as an anode and including means for adjusting the distance between the hood and the mixer disc.

2. The invention defined in claim 1 including reversing means for reversing the direction of rotation of the turntable and specimen holder.

3. The invention defined in claim 2 including speed control means for varying the speed of rotation of the turntable and specimen holder in both directions of rotation.

4. The invention defined in claim 1 including means for varying the intensity of the arc between the hood and the mixer disc to absorb the higher energy atoms and to prevent specimen distortion resulting from over heating of the specimen during coating.

5. The invention defined in claim 1 wherein the hood includes an annular member having a downwardly and outwardly extending cone-shaped portion and wherein the mixer disc includes a flat disc which is movable vertically up and down within the conical-shaped portion of the hood.

6. The invention defined in claim 1 wherein the hood includes an annular, truncated conical portion having a wire suspended in loops on the lower, inner surface of the hood and wherein the mixer disc comprises a conical-shaped portion generally centrally located within the suspended wire loops.

7. A sputtering apparatus for coating a specimen to be viewed by electron microscopy and comprising,
    sputtering means for releasing a plasma field of atoms to be deposited on the specimen as a coating, and
    specimen support means for supporting the specimen being coated,
    said specimen support means including drive means for moving the specimen into the plasma field of sputtered atoms, and wherein the sputtering means include a hood and a mixer disc and including electrical means for producing an arc of sputtered atoms between the hood an mixer disc by charging the hood as a cathode and charging the mixer disc as an anode and including means for adjusting the distance between the hood and the mixer disc.

8. The invention defined in claim 7 including means for varying the intensity of the arc between the hood and the mixer disc to absorb the higher energy atoms and to prevent specimen distortion resulting from over heating of the specimen during coating.

* * * * *